United States Patent [19]

Walker et al.

[11] Patent Number: 5,553,067
[45] Date of Patent: Sep. 3, 1996

[54] GENERATION OF CHECKING DATA

[75] Inventors: Christopher P. H. Walker, Portishead; Peter W. Thompson, Horfield, both of United Kingdom

[73] Assignee: SGS-Thomson Microelectronics S.r.l., Agrate Brianza, Israel

[21] Appl. No.: 319,951

[22] Filed: Oct. 7, 1994

Related U.S. Application Data

[63] Continuation of Ser. No. 258,979, Jun. 10, 1994, abandoned.

[30] Foreign Application Priority Data

Jun. 11, 1993 [GB] United Kingdom ............. 9312135

[51] Int. Cl.$^6$ .............................................. H04J 3/24
[52] U.S. Cl. .................. 370/60; 370/94.1; 371/37.6; 371/53
[58] Field of Search ........................ 370/60, 94.1, 18, 370/17, 105.3, 105.4, 105.5, 106; 371/30, 31, 32, 37.1, 37.2, 37.6, 37.7, 53; 341/94

[56] References Cited

U.S. PATENT DOCUMENTS

| | | | |
|---|---|---|---|
| 4,486,739 | 12/1984 | Franaszek et al. | 340/347 |
| 4,665,517 | 5/1987 | Widmer | 370/86 |
| 4,962,498 | 10/1990 | May, Jr. | 370/94.1 |
| 5,040,179 | 8/1991 | Chen | 371/37.1 |
| 5,046,069 | 9/1991 | Calvignac et al. | 371/37.1 |
| 5,103,451 | 4/1992 | Fossey | 371/37.6 |
| 5,130,977 | 7/1992 | May et al. | 370/60 |
| 5,131,012 | 7/1992 | Dravida | 375/108 |
| 5,140,583 | 8/1992 | May et al. | 370/60 |
| 5,251,215 | 10/1993 | Dravida et al. | 370/94.1 |
| 5,282,214 | 1/1994 | Dravida | 371/37.6 |
| 5,291,496 | 3/1994 | Andaleon et al. | 371/37.6 |
| 5,325,372 | 6/1994 | Ish-Shalom | 371/37.6 |
| 5,343,481 | 8/1994 | Kraft | 371/37.1 |

FOREIGN PATENT DOCUMENTS

| | | | |
|---|---|---|---|
| 0043432 | 1/1982 | European Pat. Off. | H04L 1/10 |
| 0066512 | 8/1982 | European Pat. Off. | G11B 5/09 |
| 0313707 | 5/1989 | European Pat. Off. | H04L 1/00 |
| 0366589 | 5/1990 | European Pat. Off. | |
| 0458648 | 11/1991 | European Pat. Off. | H04L 1/00 |
| 929336 | 6/1963 | Netherlands . | |
| 2001789 | 2/1979 | United Kingdom | H03K 13/00 |

OTHER PUBLICATIONS

"Embedded Check Generation For Label Swapping", *IBM Technical Disclosure Bulletin*, vol.:34 No. 10A, pp. 34–38, Mar. 1992.

D. R. Irvin, "Preserving the integrity of cyclicredundancy checks when protected text is intentionally altered", *IBM J. Res. Develop.*, vol. 33, No. 6, pp. 618–626.

Graham M. Stephens, "The What and How of CRCs", *Electronics & Wireless World*, pp. 927–930, Sep. 1989.

L. Balliet and T. J. Wylie, "Four/Six–Block Transmission Code," *Disclosure Bulletin* 22 (8B):3547–3550, 1980.

*Primary Examiner*—Alpus H. Hsu
*Assistant Examiner*—Ricky Ngo
*Attorney, Agent, or Firm*—David V. Carlson; Seed and Berry LLP

[57] ABSTRACT

A scheme for altering checking information in a message packet intended to be transmitted between computers is described. In this scheme, when an information portion of the packet is altered, checking bits contained in the packets are altered in dependence only on the set of checking bits in the message packet before modification of the information portion and on the modifications to the information portion. Thus, it is not necessary to generate new checking bits from a modified information portion.

23 Claims, 9 Drawing Sheets

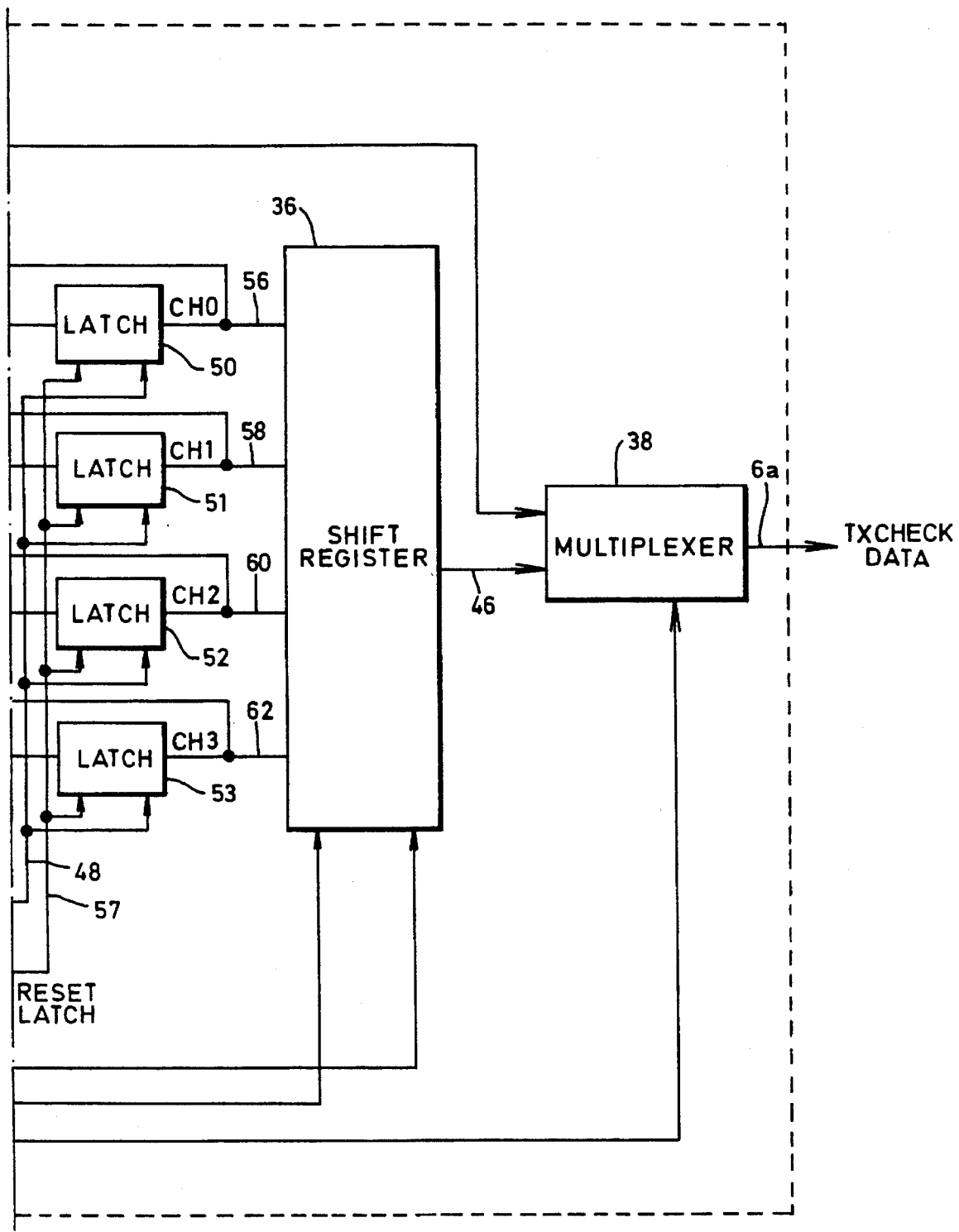
FIG. 5 (CONTD.)

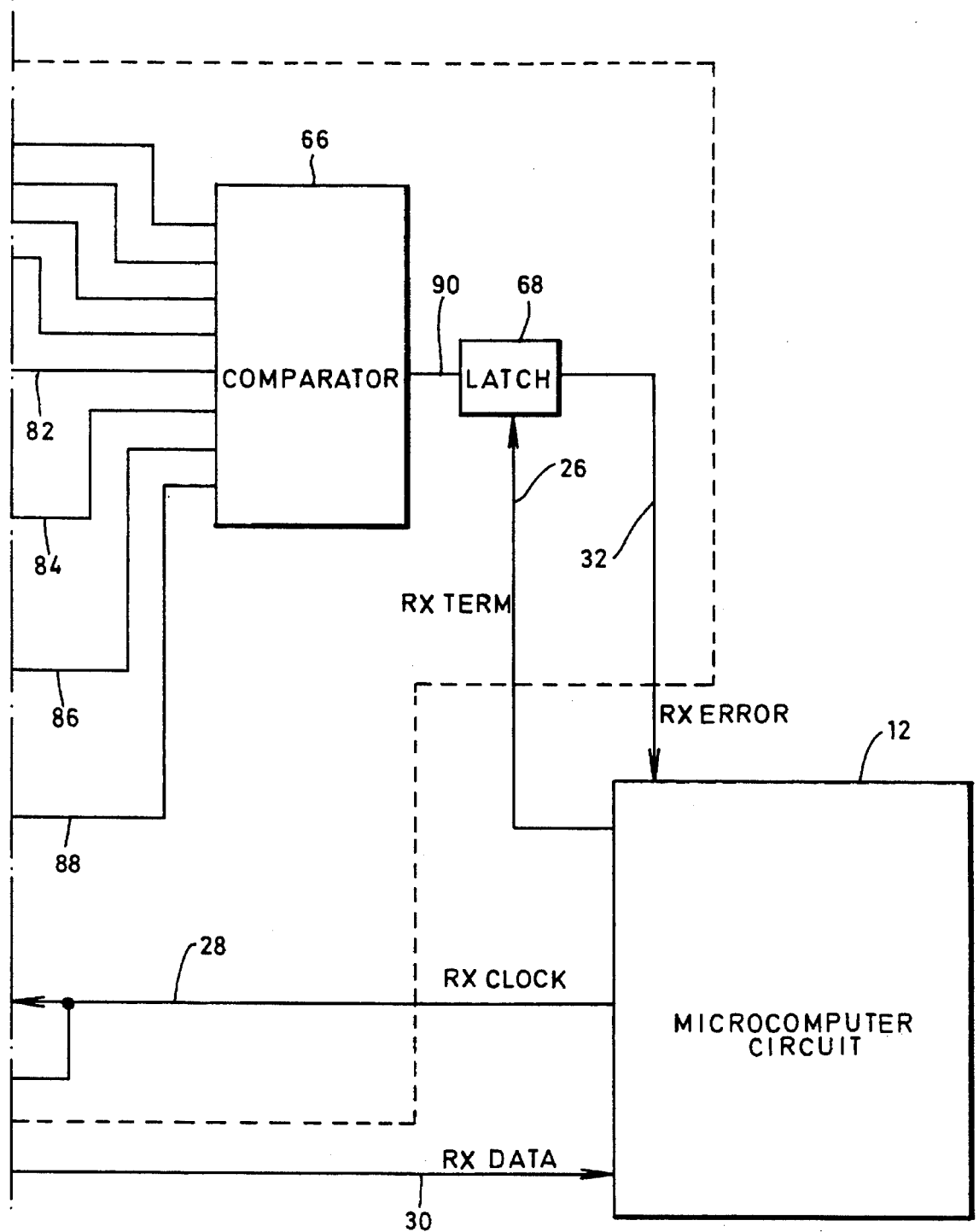
FIG. 6 (CONTD.)

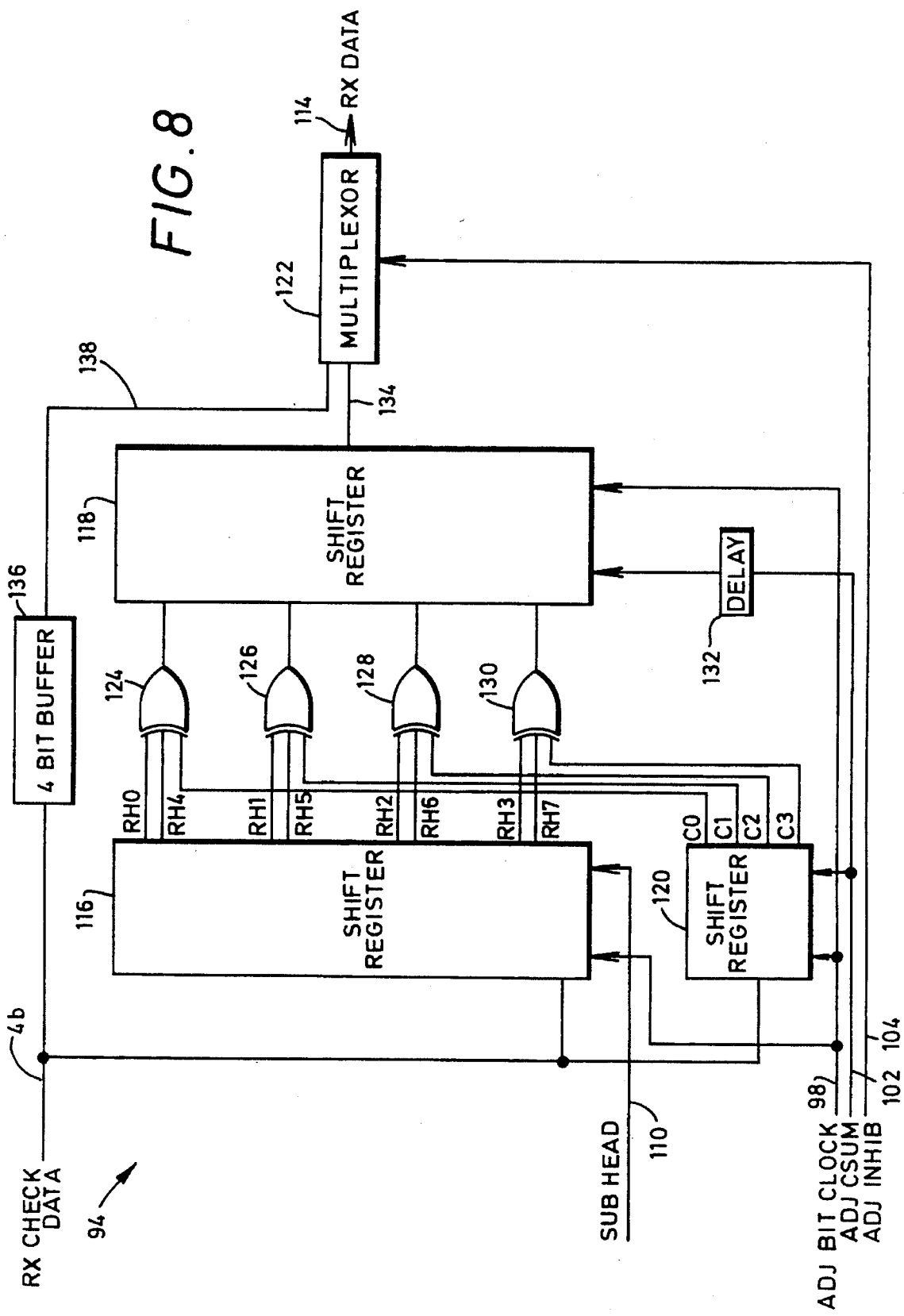

GENERATION OF CHECKING DATA

CROSS-REFERENCES TO RELATED APPLICATIONS

The present application is a continuation of U.S. patent application Ser. No. 08/258,979 filed on Jun. 10, 1994, now abandoned.

The present application is related to the following copending United States Applications:

"Transmission of Messages," invented by Christopher Paul Hulme Walker, U.S. patent application Ser. No. 08/259,521, filed on Jun. 10, 1994, previously filed in Great Britain and as British Patent Application No. 9312136.6 (Seed & Berry Attorney Docket No. 858063.404).

"Encoding Scheme," invented by Christopher Paul Hulme Walker, U.S. patent application Ser. No. 08/259,523, filed on Jun. 10, 1994, and having been previously filed in Great Britain and being identified by British Patent Application No. 9312071.5 (Seed & Berry Attorney Docket No. 858063.405).

"Encoding Digital Data," invented by Christopher Paul Hulme Walker, U.S. patent application Ser. No. 08/259,522, filed on Jun. 10, 1994, and having been previously filed in Great Britain and being identified by British Patent Application No. 9312124.2 (Seed & Berry Attorney Docket No. 858063.406).

"Communication Interface," invented by Robert J. Simpson, U.S. patent application Ser. No. 07/705,186, filed on May 24, 1991.

Each of the above-identified copending patent applications is incorporated herein by reference.

Additionally, European Patent Application No. 91304711.4 is also incorporated herein by reference. This application describes a data/strobe message format.

FIELD OF THE INVENTION

This invention relates to the generation of checking data, in particular for checking transmitted messages.

BACKGROUND OF THE INVENTION

Most efficient coding schemes used for message transmission have the effect that a single-bit error in the received data can turn into a multiple-bit error when decoded. Conventional schemes overcome these multiple-bit errors using cyclic redundancy checks (CRCs). These CRCs take the form of several checking bits transmitted at the end of a message or message packet. So-called data-strobe links, i.e., two wire links which have one wire carrying data and one wire carrying clock signals, carry very short packets, as short as 14 bits for an acknowledgement packet which comprises a ten bit data token (8 bits of data, one parity bit and one flag bit) and a four bit end of packet token (one parity bit, one flag bit and two control bits). Adding a CRC to each packet could at least double the length of the packet.

It is thus more appropriate to consider adding a CRC to a message comprising a plurality of packets rather than to a packet itself. This can be quite efficient, for example a 4 byte CRC could check a message having a length of 4 Kbytes. However, this gives rise to problems when messages are to be routed through a processor network using routing switches. Messages may be transmitted as a plurality of packets, each packet being a self-contained transmissible unit having an address portion or header, a data portion and an end of packet (EOP) indicator. Where the packet is the last packet in a message, this EOP indicator is replaced by an end of message (EOM) indicator. It is known that when routing messages through a network comprising a plurality of routing switches, headers can be altered. In one known routing arrangement, a packet has two headers, one header identifying a logical channel within a remote processor to which the message is to be sent and which remains unaltered until the message reaches its final destination and another header which identifies the terminal link of a network connected to the final destination. In that case, the header identifying the final destination is removed at that processor to reveal the logical channel header.

Where the network comprises a plurality of sub-networks, the packet can be transmitted with a plurality of headers, the first one of which identifies the outgoing link of a first sub-network. When the packet reaches that link, the first header is removed to reveal a second header identifying the outgoing link of a second sub-network. That link could be the terminal link of the final destination or entry into a further sub-network.

For routing within a network or sub-network, each routing switch can be capable of adding a randomly generated header to a packet, the randomly generated header identifying a further routing switch. When the packet reaches the routing switch identified by that header, it is then removed to reveal the original header. These header deletion and addition techniques are described in U.S. Pat. Nos. 5,130,977 (Random Header) and 5,140,583 (Wormhole Routing) the contents of which are herein incorporated by reference. In another message transmission scheme known as asynchronous transfer mode (ATM), headers are altered (or translated) during transmission.

With headers being added, deleted or translated it is very difficult to preserve a CRC on the whole packet including the headers except by stripping it on entry to a routing switch, recomputing it to take into account the new header, and then adding it into the packet on exit. Where the CRC is for a whole message rather than just one packet this is far more difficult to achieve since it requires the storage of information at the routing switch relating to all packets in the message.

Generally, therefore, in the current state of the art, either a check is provided only in respect of the data portion of the packet which will remain unaltered during transmission, or modification of the packet header is not permitted or the CRC must be completely recomputed when the header is modified.

It would be desirable to provide a way of providing a check on a whole packet which readily allows for modification of the packet while it is being transmitted between source and destination nodes.

SUMMARY OF THE INVENTION

According to the present invention there is provided a method of modifying a message packet which comprises a plurality of sets of information bits constituting an information portion and a set of checking bits, all sets containing the same number of bits and each checking bit having been generated by taking the logical sum of bits in all of the sets having the same significance, the method comprising: modifying the information portion; and altering the checking bits in dependence only on the set of checking bits in the message packet before modification of the information portion and on the modifications to the information portion.

It is particularly convenient if each set has four bits (a nibble) to provide a nibble of checking bits.

Where the packet is arranged for serial transmission the information portion comprises a header portion followed by a data portion, which is followed by a terminator portion including the set of checking bits. The terminator portion can also include control information identifying end of packet or end of message, as discussed in our previously incorporated copending application entitled "Transmission of Messages," U.S. patent application Ser. No. 08/259,521 (GB 9312136.6).

The invention also provides circuitry for modifying a message packet comprising a plurality of sets of bits constituting an information portion of said packet and a set of checking bits, each checking bit having been generated by taking the logical sum of bits in all the sets having the same significance, said circuitry comprising: an input circuit for receiving said message packet; means for modifying the information portion of said message packet; and a checking bit generator operable to modify the checking bits in dependence only on the checking bits received in the message packet and the modifications to the information portion.

When the message packet is routed through a routing switch and the header portion is altered by either deletion of a set of its bits or the addition of another set of bits, the set of checking bits is modified simply by taking the exclusive-OR of the bits in the added or deleted sets with the bits of same significance in the set of checking bits.

Where the header portion is altered by inversion of one of its bits, the set of checking bits is modified by inverting the corresponding checking bit.

Not only does this enable the checking bits to be preserved in a simple fashion but it also has the advantage that the outgoing check is a function only of the original check and changes to the packet, rather than of all the data in the packet which might have been corrupted by transmission through the switch.

For a better understanding of the present invention and to show how the same may be carried into effect reference will now be made by way of example to the accompanying drawings.

BRIEF DESCRIPTION OF THE DRAWINGS

FIG. 8 is a circuit diagram of a checksum adjuster which deletes headers.

DESCRIPTION OF THE PREFERRED EMBODIMENT

Figure 1:
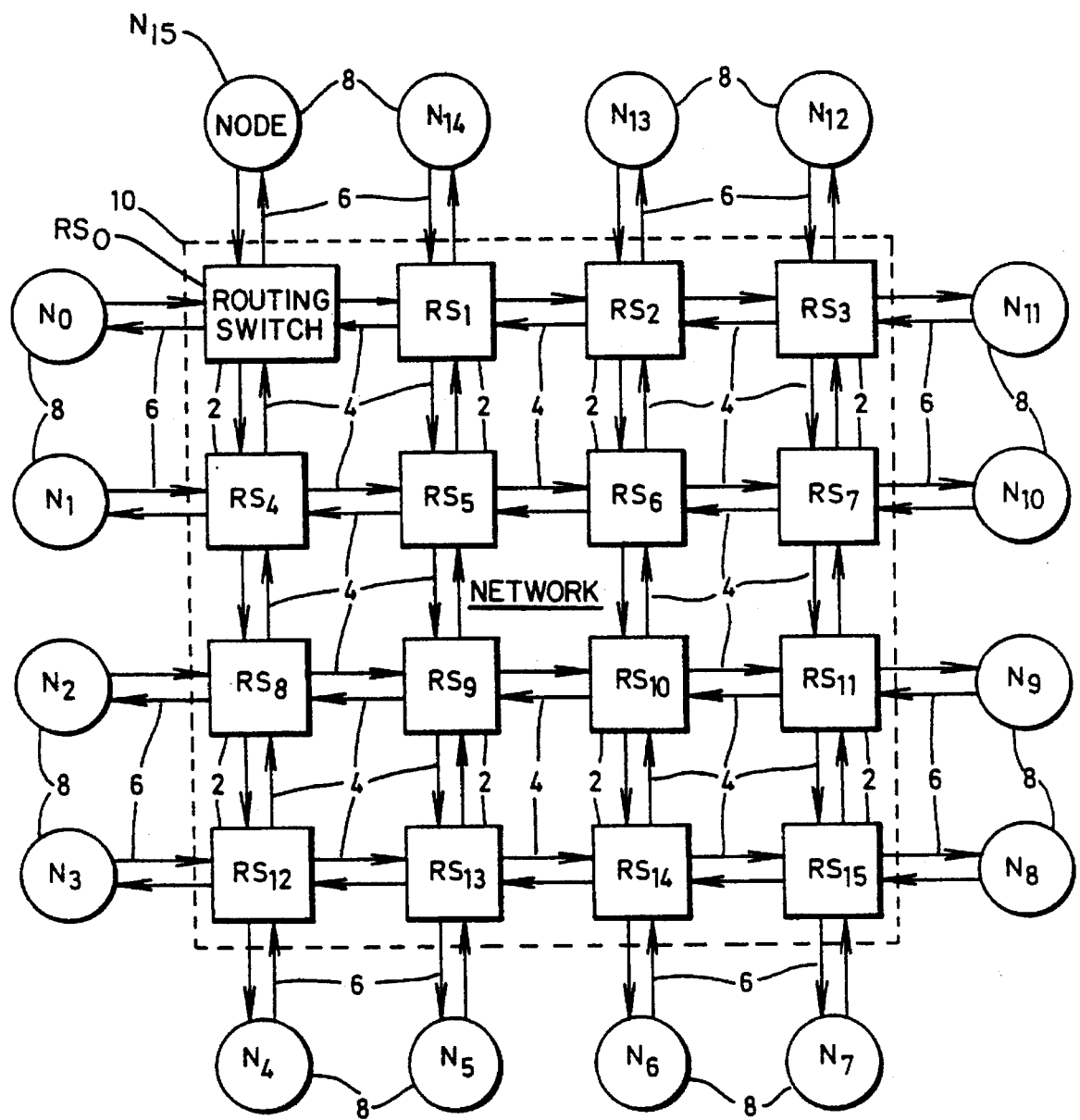
FIG. 1 is an example of a routing switch network.

FIG. 1 is a block diagram of a network 10 consisting of a plurality of routing switches 2 connected together by bidirectional message links 4. In the particular embodiment shown in FIG. 1, each of the routing switches is connected to four other routing switches, namely its immediate neighbours in the north, south, east and west directions. However, it is envisaged that each routing switch could be connected to as many other routing switches as the application required. Some of the routing switches 2 in FIG. 1 are also shown connected to source and destination nodes 8 exterior to the network 10, by further bidirectional message links 6. The bidirectional message links 6 are known as terminal links. The source and destination nodes 8 may be microcomputers such as transputers and may further include additional circuitry, as will be described in detail hereinbelow.

Messages are transmitted from the source and destination nodes 8 to the network 10 of routing switches 2 via the terminal links 6. Similarly messages are received by the source and destination nodes 8 from the network 10 of routing switches 2 via the terminal links 6.

A message is made up of at least one and usually several packets. The construction of a packet generated by a source node according to one embodiment of the present invention will now be described with reference to FIG. 2.

Figure 2:
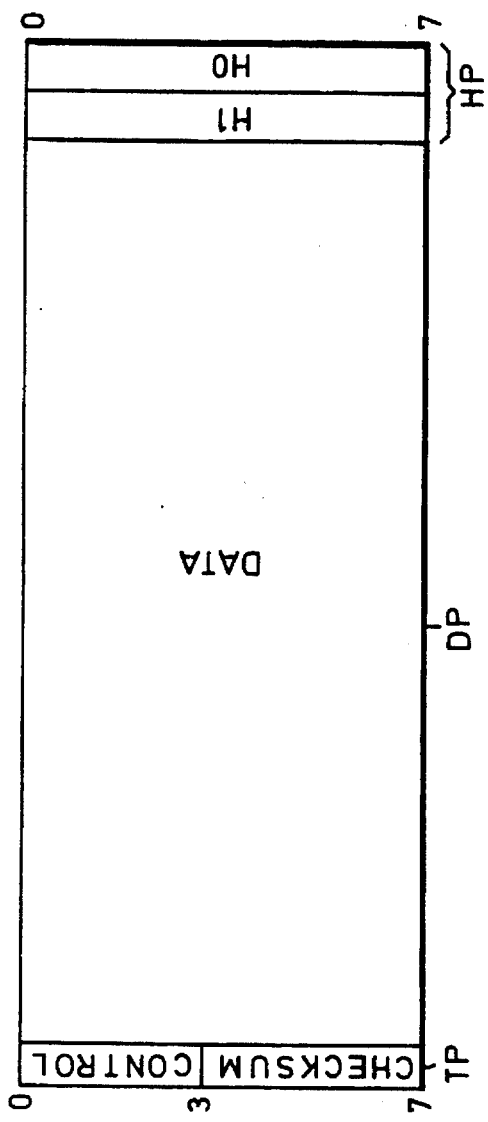
FIG. 2 is a representation of a packet having a first header arrangement for routing.

As one example, consider a packet consisting of an information portion, including a header portion HP and a data portion DP, and a terminator portion TP. The header portion HP in this example consists of two header bytes H1, H0, the first byte being H0 and the second byte being H1. H1 defines the logical channel within the destination node to which the packet is to be sent. H0 defines the address of the terminal link of the network 10 of FIG. 1 connected to the destination node to which the packet of FIG. 2 is to be sent. The header portion HP of the packet will be described in further detail hereinbelow.

The data portion DP is of variable length and consists of a plurality of sets of data bits which are to be transferred from the source node to the destination node. Herein, a set comprises four bits. It is convenient to consider the data portion as consisting of data bytes. The data portion consists of at least one and usually several data bytes.

The terminator portion TP also, in this embodiment, consists of one byte. One nibble of the byte will be a control nibble, and another nibble of the byte will be a "checksum" nibble, discussed later. The terminator portion can define the end of a packet (EOP), or when the packet is the last packet in a message, the end of a message (EOM). The checksum nibble corresponds to four longitudinal parity bits derived in a manner described hereinafter.

As described above the packet comprises a header portion including a byte of channel information H1 for identifying a channel destination of the packet, a plurality of data bytes and a terminator portion. Each data byte comprises two four bit nibbles, having bits p, q, r and s, bit p being the least significant bit of the nibble and bit s being the most significant bit of the nibble. Each longitudinal parity bit p, q, r and s is the logical sum of each of the respective bits p, q, r and s of each of the nibbles in the packet, including the nibbles which define the header portion. An example of generation of the longitudinal parity bits is given below. The data of the packet below is the sequence of bytes (in conventional Hex with the most significant nibble written on the left) Hex ED0C6F03.

|      | Binary |   |   |   |
| Hex  | lsb    |   | msb |   |
| value | p | q | r | s |
| 3 | 1 | 1 | 0 | 0 |
| 0 | 0 | 0 | 0 | 0 |
| F | 1 | 1 | 1 | 1 |
| 6 | 0 | 1 | 1 | 0 |
| C | 0 | 0 | 1 | 1 |
| 0 | 0 | 0 | 0 | 0 |
| D | 1 | 0 | 1 | 1 |
| E | 0 | 1 | 1 | 1 |
|   | 1 | 0 | 1 | 0 |

The four longitudinal parity bits 1010 are known as the checksum nibble. In the present format, the checksum nibble is transmitted as part of the terminator portion of the packet as described above. This is convenient where the terminator portion is a byte, since it reduces the need for extra transmission bits which are normally required for checking. The checksum can be used for checking the parity of the packet on receipt. The logical sum of all of the p bits of the header and data nibbles plus the p bit of the checksum nibble should be zero, and similarly the bits q, r and s when a check of the longitudinal parity is carded out using the checksum. For the example illustrated above, the check is carded out as indicated below.

|      | Binary |   |   |   |
| Hex  | lsb    |   | msb |   |
| value | p | q | r | s |
| 3 | 1 | 1 | 0 | 0 |
| 0 | 0 | 0 | 0 | 0 |
| F | 1 | 1 | 1 | 1 |
| 6 | 0 | 1 | 1 | 0 |
| C | 0 | 0 | 1 | 1 |
| 0 | 0 | 0 | 0 | 0 |
| D | 1 | 0 | 1 | 1 |
| E | 0 | 1 | 1 | 1 |
|   | 1 | 0 | 1 | 0 |
|   | 0 | 0 | 0 | 0 |

In this embodiment, the control nibble is the least significant nibble of the terminator byte and the checksum nibble is the most significant nibble of the terminator byte, which denotes an end of packet terminator portion. Where the checksum nibble is followed by the control nibble this denotes an end of message terminator. This is discussed in more detail in our previously incorporated copending application entitled "Transmission of Messages," U.S. patent application Ser. No. 08/259,521 (GB 9312136.6).

The function of the header portion of the packet will now further be described with reference back to FIG. 1. Consider the case where source and destination node $N_1$ is transmitting a packet to source and destination node $N_{10}$. The most direct route from $N_1$ to $N_{10}$ through the routing switches 2 would be through the routing switches $RS_4$, $RS_5$, $RS_6$ and $RS_7$. The source and destination node $N_1$ generates, in a manner to be described in detail hereinbelow, a packet conforming to the structure of the packet in FIG. 2. H0 denotes the terminal link 6 connected to node $N_{10}$.

In the example of FIG. 1, the source and destination node $N_1$ is only connected to one routing switch, namely $RS_4$. In an example where the source and destination node $N_1$ was connected to several routing switches, the microcomputer in the source and destination node may make a decision concerning to which routing switch the packet should first be sent, not only on the basis of the most direct route but also on the basis of the least busy route.

The packet is sent to the network 10 from the source and destination node $N_1$ on the terminal link 6 to the routing switch $RS_4$. The packet will pass through the network until it reaches, in this example, routing switch $RS_7$. Routing switch $RS_7$ is operable to recognise the header H0 and to strip off header byte H0, containing the address of its output terminal link 6 connected to source and destination node $N_{10}$ from the packet. Routing switch $RS_7$ will then send the packet down the terminal link 6 to source and destination node $N_{10}$, whereat header byte H1 is read to identify the logical channel for which the packet is intended.

It should be noted that although in this embodiment two headers are used, it is often the case that the number of headers is greater than two.

Figure 3:
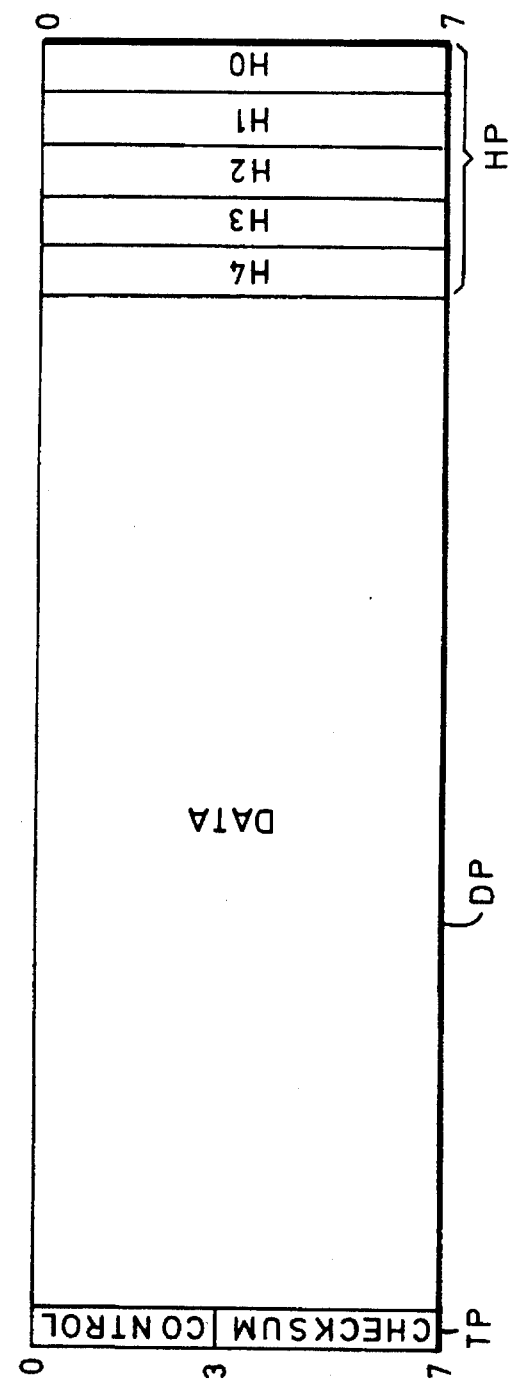
FIG. 3 is a representation of a packet having a different header arrangement for routing.

In another example, a routing network may comprise a set of sub-networks. In such an example additional header bytes may be used in the header portion to define the output terminal link of each of the sub-networks. FIG. 3 shows the construction of such a packet that is being sent from a source node to a destination node $N_{10}$ through such a network. Byte H0 would contain the address of the output terminal link of a first routing sub-network. Similarly bytes H1, H2 and H3 would contain the addresses of the output terminal links of respective subsequent routing sub-networks. Byte H4 would then define the logical channel within the node to which the packet is to be sent. Header bytes H0, H1, H2, H3 are each successively removed by respective ones of the four sub-networks before the packet is transmitted down the outgoing link of the appropriate sub-network to the appropriate destination node.

In another arrangement, each routing switch 2 can be operable to add a randomly generated header to a packet on receipt, that header then being used for subsequent routing of the packet. When the packet is received by a routing switch identified by the random header, the header is deleted to reveal the next header for subsequent routing. This is described in U.S. Pat. No. 5,130,977 referred to above.

It will be recalled that in the description of the longitudinal parity checksum nibble given earlier, the checksum nibble is calculated not only from the data bytes but also from the header bytes. It is therefore necessary that as the packet passes through the routing switch network, the checksum nibble is recalculated every time a header is added or deleted. In a further embodiment of the present invention the header portion of the packet may have headers neither added nor deleted but rather translated as they pass through routing switches. When a header is translated it is effectively the same as subtracting a header and then adding a header immediately. However, translating a header will still require alteration of the checksum nibble.

The longitudinal parity check described hereinabove is used herein for additions, deletions and translations of headers. Any byte added to the packet simply has the respective bits of its two nibbles exclusive-ORed with the longitudinal checksum nibble of the packet. Any byte removed from the packet simply has the respective bits of its two nibbles exclusive-ORed with the longitudinal checksum nibble of the packet. Translation of a byte can be implemented by subtracting a byte and then adding a byte, so both nibbles of both the subtracted and added bytes are exclusive-ORed with the longitudinal checksum nibble of the packet.

Hence it is apparent that the checksum nibble can be recalculated by a simple operation, and does not require the recalculation of the entire checksum from all of the data and header bytes in the packet. Furthermore, when the packet is transmitted serially, a routing decision can be made based on the header portion and routing can commence before the entire packet is received by the routing switch. The checksum nibble can be modified and added to the end of the packet provided that modifications to the header are stored.

Figure 4:
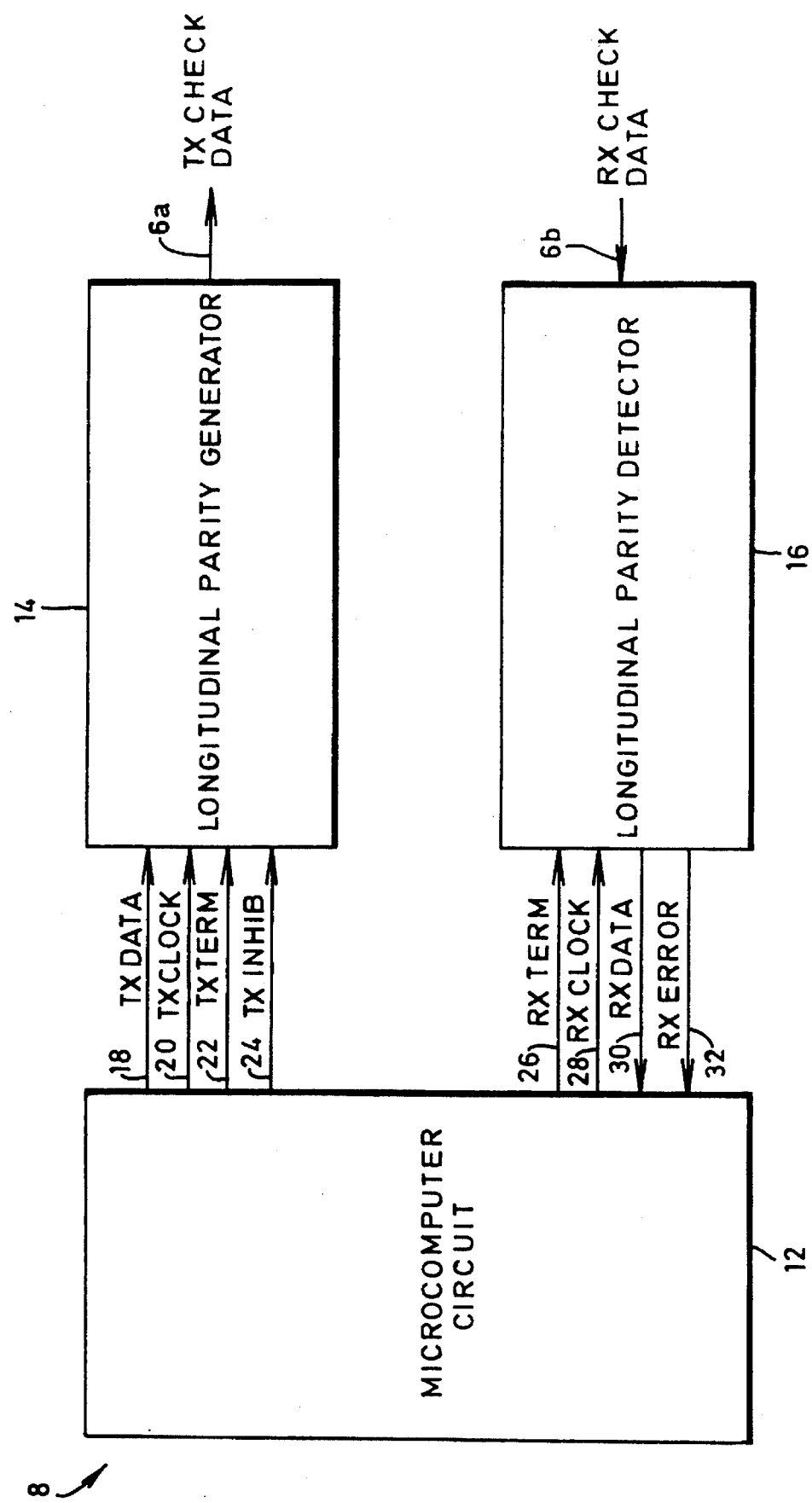
FIG. 4 is a block diagram of a source and destination node.

FIG. 4 is a block diagram of a circuit implementing one of the source and destination nodes 8 shown in FIG. 1. A microcomputer circuit 12 outputs and inputs signals between a longitudinal parity generator 14 and a longitudinal parity detector 16. The microcomputer circuit 12 outputs packets to be transmitted TX DATA on line 18, a transmit bit clock TX CLOCK on line 20, a signal indicating that the terminator portion TP of the current packet is being sent TX TERM on line 22, and a signal indicating that the transmission of data is being inhibited TX INHIB on line 24 to the longitudinal parity generator 14. The microcomputer circuit 12 further outputs a receive bit clock RX CLOCK on line 28 and a signal indicating the end of the current packet has been received RX TERM on line 26 to the longitudinal parity detector 16. The microcomputer circuit 12 further receives as inputs from the longitudinal parity detector 16 packets received RX DATA on line 30 and an error signal RX ERROR on line 32. The longitudinal parity generator 14 outputs packets to be transmitted including a checksum TX CHECK DATA on the terminal link 6a. The longitudinal parity detector 16 inputs packets received including a checksum RX CHECK DATA on terminal link 6b. The operation of the longitudinal parity generator 14 will now be described in detail with reference to FIG. 5.

Figure 5:
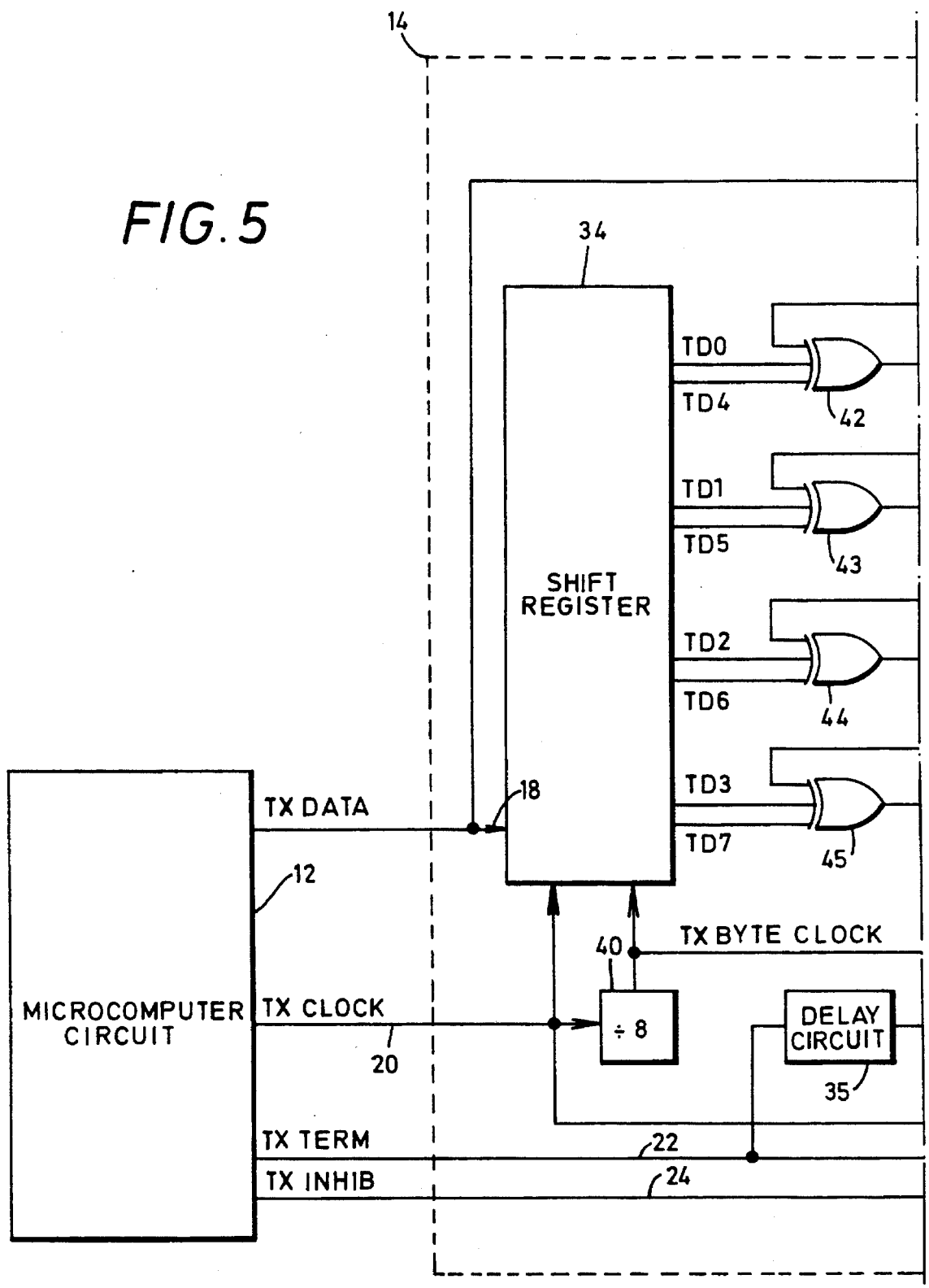
FIG. 5 is a circuit diagram of a longitudinal parity generator.

FIG. 5 shows the microcomputer circuit 12 and the longitudinal parity generator 14 incorporating shift registers 34, 36, exclusive-OR gates 42–45, latches 50–53, a divider 40, a delay circuit 35 and a multiplexer 38.

The transmit bit clock TX CLOCK on line 20 is fed as an input to a divider 40 to generate a transmit byte clock TX BYTE CLOCK on line 48. The transmit bit clock TX CLOCK and the transmit byte clock TX BYTE CLOCK are both provided as inputs to the shift register 34 along with the packet to be transmitted TX DATA on line 18. The transmit bit clock TX CLOCK clocks the bits of the packet to be transmitted TX DATA serially into the shift register 34, and the transmit byte clock TX BYTE CLOCK clocks the data packet to be transmitted TX DATA out of the shift register 34 in parallel one byte at a time. The exclusive-OR gates 42 to 45 and the latches 50 to 53 generate the longitudinal parity checksum nibble in a manner to be described in detail hereinafter.

Gate 42 receives data bits TD0 and TD4, gate 43 receives data bits TD1 and TD5, gate 44 receives data bits TD2 and TD6, and gate 45 receives data bits TD3 and TD7. Each of the gates 42 to 45 also receives a third input which is the output of its associated latch 50–53 respectively fed back. Hence the third input to each of the gates is its respective output clocked through a latch. The transmit byte clock TX BYTE CLOCK on line 48 has a rising clock edge for every time a new byte is read into the shift register 34 by eight rising clock edges of the transmit bit clock signal TX CLOCK on line 20. Hence the outputs of the latches 50–53 on lines 56–62 are an accumulation of the respective bits of successive nibbles in a packet output from the microcomputer circuit 12, as described earlier. The checksum is thus the set of bits CH0-3 representing the accumulated sum on each line 56–62. The checksum bits on lines 56–62 are output to the shift register 36 in parallel.

The shift register 36 has its inputs on lines 56–62 clocked in by the signal TX TERM on line 22 indicating that the terminator byte at the end of the packet is to be sent. According to FIG. 2, the terminator byte (EOP) consists of the control nibble followed by the checksum nibble.

The packet to be transmitted TX DATA on line 18 consists of header and data bytes. Whilst header and data bytes are being transmitted the signal TX INHIB controlling the multiplexer 38 will select the multiplexer such that the data to be transmitted TX DATA passes through the multiplexer onto the terminal link 6a, and the exclusive-OR gates 42–45 and the latches 50–53 will accumulate a checksum nibble in the manner described hereinabove. When the microcomputer circuit reaches the last data byte in the packet it is currently sending it sends the terminator control nibble and then sets the signal TX TERM on line 22 indicating that a terminator is being sent, thus latching the checksum nibble into the shift register 36. When the signal TX TERM on line 22 goes high indicating a terminator is now being sent the RESET LATCH output of the delay circuit 35 on line 57 will go high causing the latches 50–53 to be reset. The delay circuit 35 will introduce a delay between TX TERM on line 22 going high and RESET LATCH on line 57 following it. This delay allows the checksum value CH0-3 on lines 56–62 to be shifted into the shift register 36 before the latches 50–53 are reset. Subsequently, when the signal TX TERM on line 22 goes low again indicating the terminator token is no longer being sent, the signal RESET LATCH on line 57 on the output of the delay circuit 57 will go low allowing the latches 50–53 to start accumulating a new checksum. In this way the latches are always reset at the end of a packet and held so until transmission of a new packet has started.

The microcomputer circuit 12 then changes the TX INHIB signal on line 24 controlling the multiplexer 38 such that the serial output of the shift register 36 on line 46 is passed through onto the terminal link 6a. The multiplexer will be held in this state for four cycles of the transmit bit clock TX CLOCK so that the four bits of the checksum nibble are clocked out onto the message link 6a. Whilst this is occurring the microcomputer circuit will inhibit the data to be transmitted TX DATA on line 18. After four cycles of the transmit bit clock are completed the signal controlling the multiplexer 38 TX INHIB on line 24 will revert to its original state and the multiplexor will once again pass the data to be transmitted TX DATA on line 18 to the message link 6a. The microcomputer will then start to transmit the first header byte of the next data packet. In this manner, the microcomputer circuit 12 and longitudinal parity generator 14 will generate data packets including a checksum according to the format of FIG. 2.

Figure 6:
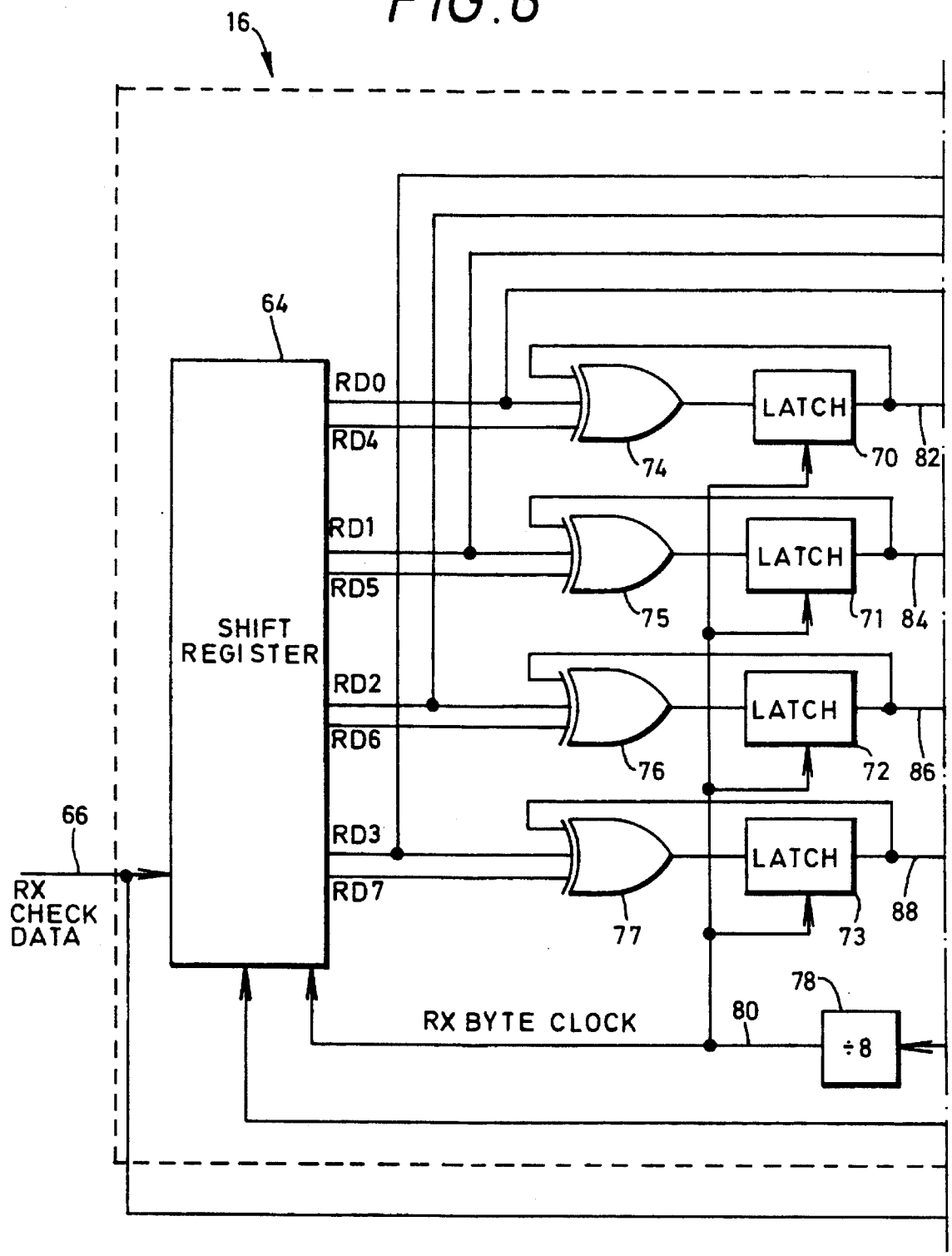
FIG. 6 is a circuit diagram of a longitudinal parity detector.

The operation of the longitudinal parity detector 16 will now be described in detail with reference to FIG. 6. FIG. 6 shows the microcomputer 12 and the longitudinal parity detector 16 incorporating a shift register 64, exclusive-OR gates 74–77, latches 68, 70–73, a divider 78 and a comparator 66.

The receive bit clock RX CLOCK on line 28 is fed as an input to the divider 78 to generate a receive byte clock RX BYTE CLOCK on line 80. The receive bit clock RX CLOCK and the receive byte clock RX BYTE CLOCK are both provided as inputs to the shift register 64 along with the received packet RX CHECK DATA including a checksum on the terminal link 6b. The receive bit clock RX CLOCK clocks the serial packet received RX CHECK DATA into the shift register 64 serially, and the receive byte clock RX BYTE CLOCK clocks the packet received RX CHECK DATA out of the shift register 64 in parallel one byte at a time. The exclusive-OR gates 74–77, the latches 70–73 and the comparator 66 carry out the longitudinal parity check in a manner to be described hereinafter.

Exclusive OR gates 74–77 and latches 70–73 combine to provide, at their outputs 82–88 a running sum of the bits received at their inputs, a new sum being calculated for every receive byte clock RX BYTE CLOCK cycle. The signal indicating receipt of a terminator byte RX TERM on line 26 is used to latch a latch 68. Hence whenever a terminator byte is received the output of the comparator 66 on line 90 is latched onto a line 32 RX ERROR indicating a longitudinal parity error. The inputs of the comparator 66 are the outputs of the latches 70–73 and the least significant nibble output from the shift register 64. The last value latched into the latches on receipt of a terminator will, in this embodiment, be the checksum nibble on the output lines RD4-7 of the shift register 64 and the terminator nibble on output lines RD0-3 of the shift register 64. As described previously if no error has occurred during transmission then once the checksum has been added to the accumulated sum of data, the output of each of the latches 70–73 should be zero. However, in this embodiment the output of the latches 70–73 will be the accumulation of the header and data nibbles plus the checksum nibble plus the control nibble. Hence, if no error has occurred the output of each of the latches will be the value of the control nibble. Hence the outputs of the latches on lines 82,84,86,88 are fed as one input nibble to the comparator 66, and the control nibble output from the shift register 64, RD0-3, is fed as a second input nibble to the comparator 66. The output of the comparator latched by the latch 68 should then be zero, indicating a nibble match, if no parity error has occurred.

Whilst the exclusive-OR gates 74–77 and the latches 70–73 are carrying out the longitudinal parity check the received packet including the checksum nibble is, in this embodiment, input directly to the microcomputer circuit 12.

In the foregoing description of the source and destination nodes 8, the generation and detection of longitudinal parity using the checksum bits has been set out. As described earlier, each routing switch 2 can add, subtract or translate headers and is capable of maintaining the checksum. Circuitry for subtracting headers from a packet and adjusting the value of the checksum nibble will be described hereinafter with respect to FIG. 7 which shows a schematic of one of the routing switches of FIG. 1.

Figure 7:
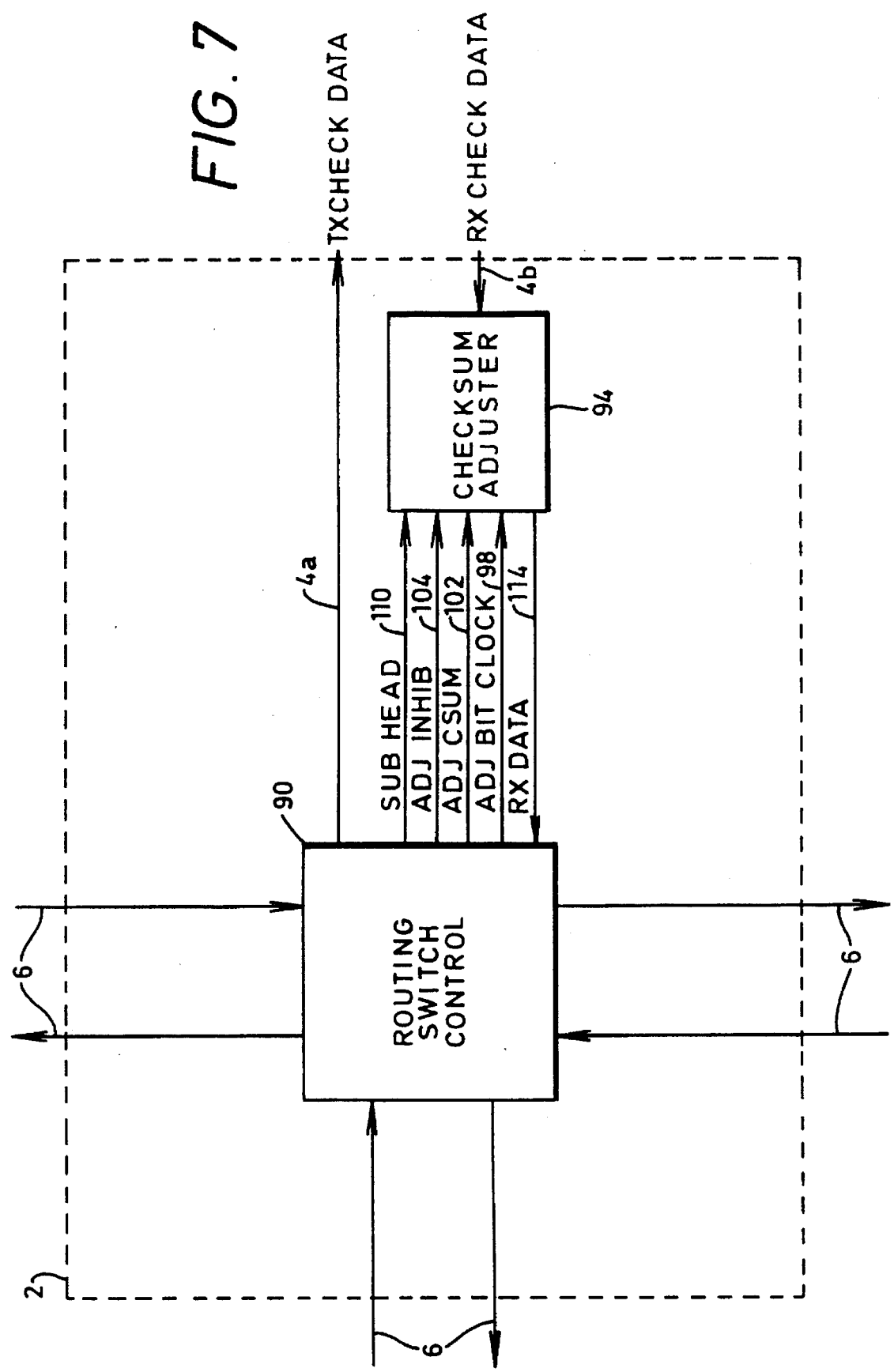
FIG. 7 is a block diagram of a routing switch.

FIG. 7 shows a routing switch 2 including a routing switch control circuit 90 and a checksum adjuster 94. Referring back to FIG. 1 it will be recalled that each routing switch in this embodiment of the invention can be connected to four other routing switches or source and destination nodes. Each routing switch 2 will have a checksum adjuster on its outputs that connect to a source and destination node 8 via a terminal link 4. The message links 6 of each routing switch are connected to the message links 6 of other routing switches 2 directly.

The routing switch control circuit 90 implements the routing functions of the switch in a manner known to persons skilled in the art, and also controls the checksum adjuster 94. The routing switch control circuit 90 outputs the packet to be transmitted TX CHECK DATA directly onto the output message link 4a. The routing switch control circuit 90 also outputs an adjuster bit clock ADJ BIT CLOCK on line 98, a signal indicating a header has been removed SUB HEAD on line 110, a signal indicating a checksum nibble has been received ADJ CSUM on line 102 and an adjuster inhibit signal ADJ INHIB on line 104 to the checksum adjuster 94. The checksum adjuster outputs the packet received RX DATA on line 114 to the routing switch control 90. The checksum adjuster 94 inputs packets including checksums RX CHECK DATA on message links 4b.

The checksum adjuster 94 provides a modified checksum taking into account bits of the header deleted from the packet by the routing switch control circuit 90 as the packet comes into the routing switch 2. The operation of the checksum adjuster 94 will now be described in detail with reference to FIG. 8.

FIG. 8 shows a circuit where the routing switch 2 performs the subtraction of a header byte. The checksum adjuster 94 adjusts the checksum nibble to take account of header bytes subtracted. The checksum adjuster of FIG. 8 contains shift registers 116,118,120, a buffer 136, a multiplexer 122, and a delay unit 132. The circuit further contains a set of exclusive-OR gates 124,126,128,130.

During reception of a packet the adjuster inhibit signal ADJ INHIB will normally be held such that the multiplexer 122 passes the packet RX CHECK DATA on message link 4b delayed through a four bit buffer 136, to the line 114 to be passed to the routing switch control 90 via line 138. The adjuster transmit bit clock ADJ BIT CLOCK clocks the inputs of the shift registers 116,120 and the output of the shift register 118. The first byte of a packet being transmitted will be the header byte that the routing switch control circuit 90 will delete from the packet. Hence when the last bit of this header byte has been clocked into the shift register 116 the routing switch control circuit 90 sends a signal indicating a header byte to be removed has been received SUB HEAD on line 110 and the bits representing the redundant header byte RH0-7 will appear in parallel on the outputs of the shift register 116, where they are fed as inputs to the exclusive-OR gates 124,126,128,130. The least significant nibble of the header byte RH0-3 and the most significant nibble of the header byte RH4-7 are fed as inputs to the respective gates 124,126,128,130. Hence the gate 124 receives bits RH0, RH4 as inputs, the gate 126 receives bits RH1, RH5 as inputs, the gate 128 receives bits RH2, RH6 as inputs and the gate 130 receives bits RH3, RH7 as inputs. At the end of the data packet being received the routing switch control circuit 90 will, after the last bit of the checksum nibble has been clocked into the shift register 120 send a signal ADJ CSUM on line 102 indicating the checksum has been received. The checksum nibble bits C0-3 will then appear in parallel on the output of the shift register 120, where they are fed as inputs to the respective gates 124,126,128,130 along with the two nibbles of the redundant header byte. The output of the gates 124,126,128,130, representing the new checksum value, are then clocked into the shift register 118 by the signal indicating the checksum has been received ADJ CSUM on line 102 after it has passed through a delay circuit 132. At this time the old checksum bits received are stored in the four bit buffer 136. The delay circuit 132 allows for the gates 124, 126, 128, 130 to propagate the new checksum result. When the new checksum has been written into the shift register 118 and the checksum is ready to be transmitted as part of the packet, the inhibit signal ADJ INHIB on line 104 changes the multiplexer so as the new checksum value on line 134 appears in the checksum slot of the packet received on line 114. Whilst the four bits of the new checksum are transmitted from the shift register 118 on the received data RX DATA line 114, the four bits of the old checksum, in the buffer 136, will be overwritten by the first four bits of the next packet header received.

It is envisaged that in one embodiment the packet entering a routing switch may be subjected to a longitudinal parity check as described above with reference to FIG. 6. This means that if data in the packet has been corrupted travelling through the routing switch network this corruption will be detected by a longitudinal parity check prior to adjusting the checksum, rather than the corruption being incorporated in the longitudinal parity checksum nibble and the packet being erroneously interpreted as error free.

The invention has been particularly described with reference to one particular embodiment, namely that in which a header byte is removed from a packet during transmission. It will readily be understood however, how the circuits of FIGS. 7 and 8 could be adapted to enable other embodiments to be implemented. For example, the circuit of FIG. 8 could be configured, to enable the checksum to be adjusted when header bytes are added to the packet rather than deleted from the packet. It will be further appreciated that the circuit of FIG. 8 could be configured to enable the adjustment of the checksum when a header is translated (i.e., an addition of a header following subtraction of a header). It should also be apparent that such addition, subtraction or translation circuitry could be implemented at any stage of the network that a packet passes through in travelling from its source to its destination. In the preferred embodiment headers are only deleted by routing switches connected to source and destination nodes as packets leave the routing network. Therefore only those sides of the routing switches which are connected to the source and destination nodes have checksum adjusters for deletion of headers.

While reference has been made herein to header bytes, it will be appreciated that each alterable header portion could be of a different length, e.g. two bytes. The principle of the invention remains unaltered.

What is claimed is:

1. A method of modifying a message packet which comprises a plurality of sets of information bits constituting an information portion and a set of checking bits, all sets containing the same number of bits in a sequence of bit locations between a bit location of least significance to a bit location of most significance, and each checking bit having been generated by taking the logical sum of bits having the same significance in all of the sets, the method comprising:

modifying the information portion of said message packet; and altering the checking bits by using only the set of checking bits in the unmodified message packet and the modifications to the information portion.

2. A method according to claim 1 wherein the step of modifying the information portion comprises inverting at least one information bit in a place of certain significance within a set of bits and wherein the step of altering the checking bits comprises inverting the bit in the place of same significance in the set of checking bits.

3. A method according to claim 2 wherein the message packet is arranged for serial transmission with the information portion preceding the set of checking bits.

4. A method according to claim 3 wherein the message packet includes a terminator portion following said information portion, said terminator portion including control information defining the end of packet and said set of checking bits.

5. A method according to claim 1 wherein the message packet is arranged for serial transmission with the information portion preceding the set of checking bits.

6. A method according to claim 5 wherein the message packet includes a terminator portion following said information portion, said terminator portion including control information defining the end of packet and said set of checking bits.

7. A method according to claim 1 wherein the step of modifying the information portion comprises adding or deleting a set of bits and wherein the step of altering the checking bits comprises taking the exclusive-OR of each bit within said added or deleted set with the bit in a place of corresponding significance within the set of checking bits.

8. A method according to claim 7 wherein the message packet is arranged for serial transmission with the information portion preceding the set of checking bits.

9. A method according to claim 8 wherein the message packet includes a terminator portion following said information portion, said terminator portion including control information defining the end of packet and said set of checking bits.

10. A method according to claim 1 wherein the information portion of said message packet includes a header portion comprising at least one set of address bits.

11. A method according to claim 10 wherein the header portion comprises a plurality of sets of address bits providing first and second headers and wherein said step of modifying the information portion comprises removing one of said headers.

12. A method according to claim 11 wherein each header is one byte.

13. A method according to claim 10 wherein the header portion comprises a plurality of sets of address bits providing first and second headers and wherein said step of modifying the information portion comprises adding at least one set of address bits to said packet.

14. A method according to claim 1 wherein the step of modifying the information portion includes adding at least one set of address bits to said packet.

15. A method according to claim 1 wherein each set of bits has four bits.

16. A method according to claim 1 wherein the information portion of said message packet includes a header portion comprising at least one set of address bits, wherein each set of bits has four bits and wherein each header is one byte.

17. A method of transmitting a message packet between source and destination nodes via a network having a plurality of routing nodes, each message packet comprising a plurality of sets of information bits constituting an information portion and a set of checking bits, all sets containing the same number of bits in a sequence of bit locations between a bit location of least significance to a bit location of most significance, and each checking bit having been generated by taking the logical sum of bits having the same significance in all of the sets, wherein a method of modifying the message packet is effected at at least one node in the network, this method comprising:

modifying the information portion of said message packet; and altering the checking bits by using only the set of checking bits in the unmodified message packet and the modifications to the information portion.

18. Circuitry for modifying a message packet comprising a plurality of sets of information bits constituting an information portion of said packet and a set of checking bits, all sets containing the same number of bits in a sequence of bit locations between a bit location of least significance to a bit location of most significance, and each checking bit having been generated by taking the logical sum of bits having the same significance in all the sets, said circuitry comprising:

an input circuit for receiving said message packet;

means for modifying the information portion of said message packet; and a checking bit generator operable to modify the checking bits by using only the checking bits received in the message packet and the modifications to the information portion.

19. Circuitry according to claim 18 wherein the checking bit generator comprises logic circuitry for taking the exclusive-OR of checking bits with modified information bits having the same place of significance in their respective sets.

20. A routing switch for receiving and routing message packets comprising a plurality of sets of information bits constituting an information portion of said packet and a set of checking bits, all sets containing the same number of bits in a sequence of bit locations between a bit location of least significance to a bit location of most significance, and each checking bit having been generated by taking the logical sum of bits having the same significance in all the sets, each routing switch comprising circuitry for modifying a message packet, said modifying circuitry comprising:

an input circuit for receiving said message packets;

means for modifying the information portion of said message packet; and a checking bit generator operable to modify the checking bits by using only the checking bits received in the message packet and the modifications to the information portion.

21. A routing switch according to claim 20 which comprises a header deletion circuit for deleting a set of bits from said information portion before routing the message packet.

22. A routing switch according to claim 21 which comprises header addition circuitry for adding a set of address bits to said information portion before routing the message packet.

23. A routing switch according to claim 20 which comprises header addition circuitry for adding a set of address bits to said information portion before routing the message packet.

* * * * *

UNITED STATES PATENT AND TRADEMARK OFFICE
CERTIFICATE OF CORRECTION

PATENT NO. : 5,553,067
DATED : September 3, 1996
INVENTOR(S) : Christopher P.H. Walker et al.

It is certified that error appears in the above-indentified patent and that said Letters Patent is hereby corrected as shown below:

On the title page Item [73] denoting the Assignee, please delete "SGS-Thomson Microelectronics S.r.l." and insert therefor --SGS-Thomson Microelectronics Limited--.

On the title page Item [73] denoting the Assignee's address, please delete "Agrate Brianza, Israel" and insert therefor --Bucks, United Kingdom--.

Signed and Sealed this

Nineteenth Day of August, 1997

Attest:

BRUCE LEHMAN

Attesting Officer

Commissioner of Patents and Trademarks